US011690295B2

(12) United States Patent
Taylor et al.

(10) Patent No.: US 11,690,295 B2
(45) Date of Patent: Jun. 27, 2023

(54) SUBLIMATION PROTECTION COATING FOR THERMOELECTRIC MATERIALS AND DEVICES

(71) Applicant: U.S. Army Combat Capabilities Development Command, Army Research Laboratory, Adelphi, MD (US)

(72) Inventors: Patrick J. Taylor, Oakton, VA (US); Jay R. Maddux, Greenbelt, MD (US); Kimberly A. Olver, Ellicot City, MD (US); Sina Simingalam, McLean, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 16/901,138

(22) Filed: Jun. 15, 2020

(65) Prior Publication Data

US 2021/0391521 A1    Dec. 16, 2021

(51) Int. Cl.
| | | |
|---|---|---|
| *H10N 10/17* | (2023.01) | |
| *H10N 10/82* | (2023.01) | |
| *H01L 35/32* | (2006.01) | |
| *H01L 35/10* | (2006.01) | |

(52) U.S. Cl.
CPC .............. *H01L 35/32* (2013.01); *H01L 35/10* (2013.01)

(58) Field of Classification Search
CPC ................................. H01L 35/32; H01L 35/10
See application file for complete search history.

(56) References Cited

U.S. PATENT DOCUMENTS

| | | | |
|---|---|---|---|
| 3,969,743 A | 7/1976 | Gorski | |
| 6,452,206 B1* | 9/2002 | Harman | H01L 35/16 257/17 |
| 9,293,680 B2 | 3/2016 | Poliquin et al. | |
| 2010/0229910 A1 | 9/2010 | Paik et al. | |
| 2011/0016888 A1* | 1/2011 | Haa | H01L 35/32 62/3.3 |
| 2015/0333242 A1* | 11/2015 | Levy | F03G 7/04 136/200 |
| 2016/0064638 A1* | 3/2016 | Salvador | H01L 35/34 136/201 |

(Continued)

OTHER PUBLICATIONS

Zawadzka et al., "Enhancement of oxidation resistance of CoSb3 thermoelectric material by glass coating", Materials and Design, 119, pp. 65-75. (Year: 2017).*

(Continued)

*Primary Examiner* — Tamir Ayad
(74) *Attorney, Agent, or Firm* — Eric B. Compton

(57) ABSTRACT

Protective coating to prevent sublimation are disclosed. More particularly, the protective coatings comprise one or more alkaline earth halide materials, or mixtures thereof, to prevent sublimation. The alkaline earth halide material of the coating can be judiciously selected to match the coefficient of thermal expansion (CTE) of the material of the external surface of the underlying substrate coated. The protective coatings may be advantageous for protecting external surfaces of thermoelectric materials, parts and devices at high temperature to prevent sublimation and material loss.

25 Claims, 6 Drawing Sheets

(56) References Cited

U.S. PATENT DOCUMENTS

2020/0035897 A1\* 1/2020 Jovovic .................. H01L 35/30

OTHER PUBLICATIONS

Sharp, J.W. et al., "Thermoelectric properties of CoSb3 and related alloys", Journal of Applied Physics 78, 1013 (Year: 1995).\*
Patel, S.M. et al., "Use of GaSb films as residual gas pressure monitors", J. Phys. E: Sci. Instrum., vol. 14, pp. 1-3. (Year: 1981).\*
Song, Byeongcheol et al., "The effects of diffusion barrier layers on the microstructural and electrical properties in CoSb3 thermoelectric modules", Journal of Alloys and Compounds 617, pp. 160-162. (Year: 2014).\*
"Aerogels for Thermal Insulation of Thermoelectric Devices Energy-conversion efficiencies would be increased," NASA's Jet Propulsion Laboratory, NASA Tech Briefs, NPO-40630, Jul. 2006, p. 19.
J. Sakamoto, J. Paik, S. Jones, and B. Nesmith, "Hybrid Multifoil Aerogel Thermal Insulation", NASA TechBriefs, NPO-45219, Oct. 2008, pp. 15-16.
P. Fedorova, et al., "Coprecipitation from Aqueous Solutions to Prepare Binary Fluorides", Russian Journal of Inorganic Chemistry, vol. 56, No. 10, 1525 (2011).
Doug Crane, Presentation titled "Thermoelectric Waste Heat Recovery Program for Passenger Vehicles," Gentherm Inc., Project ID # ACE080, Presentation slides dated May 17, 2013. Available online at: https://www.energy.gov/sites/prod/files/2014/03/f13/ace080_crane_2013_o.pdf (Slide 11).
Brian Lee Berger, "Development of a Protective Coating for TAGS-85 Thermoelectric Material," Master's Thesis, The School of Engineering of the University of Dayton, Aug. 2013, Available online at: http://rave.ohiolink.edu/etdc/view?acc_num=dayton1375129912.
Products, MicroPower Global © 2019, available online at: https://micropower-global.com/products/ (website accessed Jun. 8, 2020).
Andrew Zimmerman Jones, "Sublimation." ThoughtCo, available at: thoughtco.com/sublimation-2699011 (updated Jan. 29, 2019).
Shields, V, and Noon, E L., "Sublimation measurements and analysis of high temperature thermoelectric materials and devices," United States: N. p. 1983 (Abstract), available at: https://www.osti.gov/biblio/5403462-sublimation-measurements-analysis-high-temperature-thermoelectric-materials-devices.
S. Gross, "Infrared sensor cooling by the Joule-Thompson effect," Infrared Physics, Jun. 1966, pp. 47-56 (Abstract), available online at: https://www.sciencedirect.com/science/article/abs/pii/0020089166900236.
Joseph Caniou, "The cooling of detectors," Chap. 3 Passive Infrared Detection, 1999, pp. 521-546 (Abstract), available online at: https://link.springer.com/chapter/10.1007/978-1-4757-6140-5_14.
Clemens J. M. Lasance, "The coefficient of thermal expansion," Electronic-Cooling.com, Jan. 1, 1998, available online at: https://www.electronics-cooling.com/1998/01/the-coefficient-of-thermal-expansion/.

\* cited by examiner

Figure 1 (Background)

SUBLIMATION PROTECTION COATING FOR THERMOELECTRIC MATERIALS AND DEVICES

GOVERNMENT INTEREST

The invention described herein may be manufactured, used, and licensed by or for the United States Government.

BACKGROUND OF THE INVENTION

I. Field

The present invention relates generally to protective coatings, and more particular, to protective coatings to prevent sublimation. The protective coatings may be applied to thermoelectric materials and devices.

II. Description of Related Art

Thermoelectric power generation devices convert thermal energy (heat) into electrical power. For instance, some automotive systems have an incorporated thermoelectric power generation unit on the exhaust that convert otherwise wasted heat into electrical power. Radioactive (nuclear) thermoelectric generators, typically used for spaced-based power, harness the heat generated by decaying of atomic nuclei to produce electricity.

FIG. 1 is a schematic of a typical thermoelectric power generating device 500. It comprises P-type and N-type semiconductors spaced between, and in parallel, with metal interconnects. The thermoelectric device 500 accepts a thermal (heat) input, $Q_{input}$. In this particular illustration, the top metal interconnect or contacts of the device 500, where the heat input, is received may be referred to as the "Hot-Side" metal interconnect, whereas the bottom surface(s) of device, opposite to the heat input, may be referred to as the "Cold-Side" metal interconnects. With heat applied there is a temperate difference, $\Delta T$, between the Hot-Side and Cold-Side metal interconnects and the P-type and N-type semiconductors. The thermoelectric device 500 generates a voltage potential, $\Delta V$, in response the temperature difference, $\Delta T$. Because the magnitude of that power is proportional to $\Delta T^2$ and the efficiency is proportional to the temperature different $\Delta T$, there is significant benefit and interest to operate thermoelectric devices across increasingly larger $\Delta T$.

In practice, however, there are significant and challenging issues that must be solved when employing sources of heat that have higher temperatures, and larger temperature differences. One of these problems is sublimation which is encountered by the active surfaces of thermoelectric devices at high temperature. This include the external surfaces of semiconductors.

Sublimation is the natural evaporation of material in response to elevated temperature until the equilibrium vapor pressure is obtained. The heat of sublimation of a material is a natural constant that governs the rate of material loss from the solid phase to the vapor phase without transitioning through the liquid phase.

Because thermoelectric devices can operate for years, and even decades, in contact with a heat source at high temperature, there is a tendency for the exposed surface of the materials of the P-type and N-type semiconductors to sublime and to lose material. This material loss from sublimation may be most pronounced at the interface of the semiconductors and the metal interconnects. This results in necking at those locations, especially at the interface of the Hot-Side interconnect.

Some examples of material used to fabricate high-performance thermoelectric power generators are lead telluride (PbTe) and lead selenide (Pb Se), along with tin selenide (SnSe) which may be added to PbTe or PbSe as a dilute alloying agent.

FIG. 2 is a plot of the beam equivalent pressure of PbTe, PbSe, and SnSe as a function of temperature as an index for equilibrium vapor pressure. The equilibrium vapor pressure of PbTe is proportional to the "beam equivalent pressure" (BEP) which is a property that is easily determined in a laboratory setting. On the plot, the identified percentages correspond to percentage of full scale electrical power that was applied to the heaters to evaporate the materials. The BEP of PbTe was determined experimentally and is shown as squares. The BEP of PbTe is found to exponentially increase as the temperature is increased following the general form: $=(0.6192)\exp^{0.0127(T)}$. Thermoelectric devices based on PbTe have excellent performance at approximately 450° C. and 500° C. Beyond these temperatures, the sublimation loss of PbTe at operating temperature is a critical issue that needs to be controlled.

The vapor pressure of related materials, lead selenide (PbSe, triangles) and tin selenide (SnSe, circles) are also included for comparison and show a similar trend and sublimation problem.

Current approaches to address the problem of sublimation of the materials forming a thermoelectric device at high temperature have not been successful. One approach includes applying thick oxide coatings that are not matched in coefficient of thermal expansion. The most popular is an aluminum oxide (alumina) coating, although, $SiO_2$ and $TiO_2$ coating have also been used. Another approach uses a thin metal foil, such as titanium, wrapped around the surface. This approach risks completely electrically short-circuiting the device. Probably the most popular sublimation protection approach is the use of silica-based aerogels which have very low thermal conductivity. However, aerogels do not actually stop sublimation, they only contains sublimed material in the free/open space between the device and the aerogel. In time, this diffuses away and the overall net effect is sublimation is slowed. Another disadvantage is that over time, aerogels tend to densify and shrink, and therefore the effectiveness decreases with age. Yet another approach is using an inert gas atmosphere, such as nitrogen or argon, to backfill the environment around thermoelectric devices. The gas pressure reduces the evaporation of material to retard sublimation, but it cannot stop sublimation.

A better solution to preventing sublimation is sought.

SUMMARY OF THE INVENTION

Protective coatings to prevent sublimation are disclosed. More particularly, the protective coatings comprise one or more alkaline earth halide materials, or mixtures thereof, to prevent sublimation. The alkaline earth halide material of the coating can be judiciously selected to match the coefficient of thermal expansion (CTE) of material of the external surface of the underlying substrate coated. The protective coatings may be advantageous for protecting external surfaces of thermoelectric materials, parts and thermoelectric devices at increasingly high temperature to prevent sublimation and material loss.

According to embodiments, a thermoelectric part comprises: a substrate comprising a thermoelectric material; and a protective coating comprising an alkaline earth halide on an external surface of the substrate. The protective coating prevents sublimation of the surface of the substrate at a temperature of at least 350° C.

The external surface of the substrate may be formed of a thermoelectric material, such as lead telluride (PbTe), lead selenide (Pb Se), tin telluride (SnTe), cobalt triantimonide ($CoSb_3$) and TAGS, i.e., a p-type alloy of tellurium (Te) and germanium (Ge), as some non-limiting examples.

The alkaline earth halide of the protective coating comprises any compound of a group II element and a group VII element of the periodic table. If the halide is a fluoride, these include magnesium fluoride ($MgF_2$), calcium fluoride ($CaF_2$), strontium fluoride ($SrF_2$) and barium fluoride ($BaF_2$). The protective coating may comprise one or more alkaline earth halide materials or mixtures thereof. The thickness of the protective coating may be less than about 1 µm as a non-limiting example. The protective coating is preferably chemically inert with respect to the material of the external surface of the substrate.

The protective coating material and the material of the external surface of the substrate are selected to have similar or nearly identical coefficients of thermal expansion. For instance, the two materials may preferably have coefficients of thermal expansions within about ±12% of each other. To provide maximum protection, the external surface of the substrate may be completely sealed by the protective coating. The thermoelectric part is preferably configured to operate at a temperature in excess of 450° C. The part may comprise at least one semiconductor of the thermoelectric device. The semiconductor(s) may be a P-type or N-type semiconductor.

According to other embodiments, a thermoelectric device comprises: semiconductors spaced between, and in parallel, with conductive interconnects, such that when thermal energy is applied to one of the interconnects, there is temperate difference across the semiconductors which generates a voltage potential. The thermoelectric device is configured to operate at a temperature of at least of at least 350° C., and the external surfaces of the semiconductors have a protective coating of an alkaline earth halide to prevent sublimation at the operating temperature.

According to further embodiments, a protective coating comprises: an alkaline earth halide formed on an external surface of a substrate, wherein the protective coating prevents sublimation of the external surface of the substrate at a temperature of at least 350° C.

According to yet further embodiments, a method of preventing sublimation comprises: providing a substrate; forming a protective coating comprising an alkaline earth halide on the substrate. The protective coating prevents sublimation of the surface of the substrate at a temperature of at least 350° C. The protective coating may be applied by direct evaporation, such as by using vacuum evaporation or a solution-precipitation process, as non-limiting examples. The method may further comprises performing a heat treatment after forming the protective coating. One exemplary heat treatment scheduled is detailed in FIG. 5.

These and other embodiments of the invention are described in more detail below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments, including less effective but also less expensive embodiments which for some applications may be preferred when funds are limited. These embodiments are intended to be included within the following description and protected by the accompanying claims.

DETAILED DESCRIPTION

Figure 1:
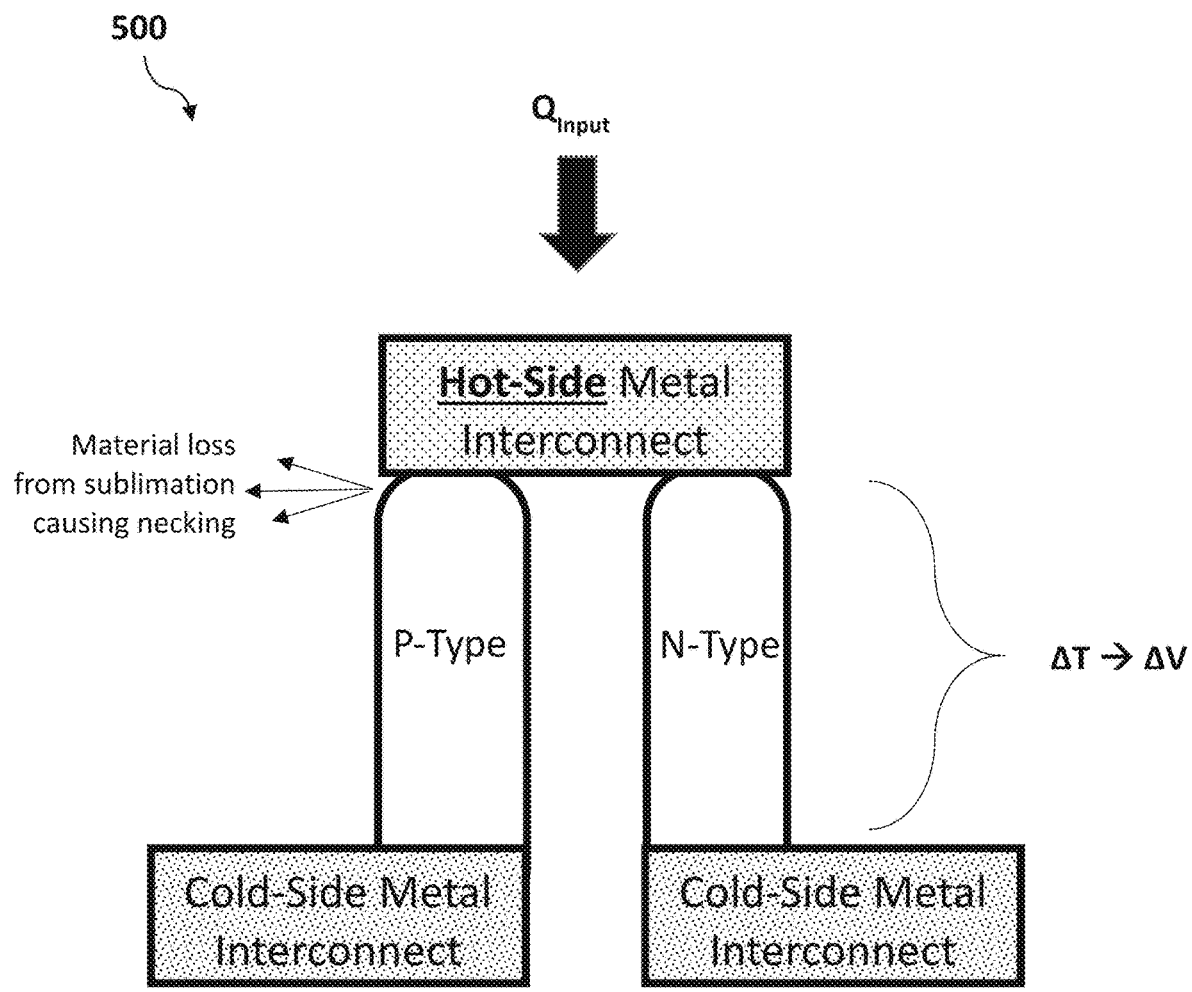
FIG. 1 is a schematic of a typical thermoelectric power generating device.

According to embodiments, there is protective a coatings to prevent sublimation. More particularly, the protective coating comprise one or more alkaline earth halide materials, or mixtures thereof, to prevent sublimation. The protective coating may comprise an ultra-thin layer or layers of an alkaline earth halide that is monolithically integrated directly on the surface of the material to be protected.

The protective coating may be advantageous for protecting external active surface of thermoelectric materials, parts and devices at increasingly high temperature to prevent sublimation and material loss. Semiconductors are the materials/parts that primarily experience sublimation. The other components are usually metals and do not tend to sublime at the temperatures of operation. The protective coatings described herein can be applied to active surface of many different types of thermoelectric devices, such as thermoelectric power generation devices as well as thermoelectric cooling devices that operate at high temperature as non-limiting examples.

Such devices may have relevant operational temperatures of at least 350° C., and more likely above 450° C. or 500° C., where sublimation can be an issue.

Because the ultra-thin alkaline earth halide coating layer does not sublime at the relevant temperatures of operation for thermoelectric devices, and it has the advantage that it has a similar or nearly identical coefficient of thermal expansion, the embodiments described here in yield the following successful attributes: the thin layer simultaneously prevents sublimation, is chemically inert, and remains monolithic and free of stress-cracks for the duration of service life.

Thermoelectric materials are materials which strongly demonstrate the thermoelectric effect, i.e., the phenomenon by which a temperature difference creates an electric potential or vice versa. The thermoelectric effect includes three separately identified effects: the Seebeck effect, Peltier effect and Thomson effect.

Table 1, below, provides coefficients of thermal expansion for some classic thermoelectric materials: lead telluride (PbTe), tin selenide (SnSe), lead selenide (PbSe), cobalt triantimonide ($CoSb_3$) and TAGS-85.

More generally, an alloy system of lead (Pb), tellurium (Te), selenium (Se), and/or tin (Sn) may be used for the thermoelectric material according to the following chemical equation: $(Pb_{1-x}Sn_x)(Te_{1-y}Se_y)$, where $0 \le x \le 1$ and $0 \le y \le 1$. Lead telluride (PbTe), tin selenide (SnSe) lead, selenide (Pb Se), and are two element compounds of this family which may be used. It is noted that tin selenide (SnSe) in its pure form has a different structure. It could though be added to PbTe and/or PbSe as a dilute alloying agent. As a dilute alloying agent, the material would have the thermal expansion of the material that it was alloyed into (e.g., PbTe or Pb Se).

$CoSb_3$ is a skutterudite-material. TAGS is a p-type alloy of germanium (Ge) of tellurium (Te) commonly used in thermoelectric materials. The alloy known as TAGS-85 is one example comprised of 85% GeTe. In addition, PbTe, $CoSb_3$ and TAGS may be used as base materials, and may be mixed or alloyed together and/or with other elements and compounds.

In general, the aforementioned exemplary thermoelectric materials all tend to exhibit the same sublimation problems at high temperature and would be similarly benefited by a protective coating comprising alkaline earth halide materials.

Alkaline earth halide materials are non-reactive (inert), electrically insulating, have extremely low equilibrium vapor pressure, and can be formed as a very dense thin-film. Alkaline earth halide materials include compounds that form between a group II element and a group VII element of the periodic table, such as magnesium halides, calcium halides, strontium halides and barium halides. If the halide is a fluoride, these include magnesium fluoride ($MgF_2$), calcium fluoride ($CaF_2$), strontium fluoride ($SrF_2$) and barium fluoride ($BaF_2$).

In its simplest embodiments, the protective coating may only include one or more alkaline earth halide(s). However, it should be appreciated that other constituent materials (e.g., elements and/or compounds) might be included in other embodiments for reasons beyond the primary purposes of preventing sublimation and material loss. Table 2, below, provides coefficients of thermal expansion of these four alkaline earth fluoride coating materials. Most importantly, for preventing sublimation, the protective coating material should have the same or similar coefficient of thermal expansion (CTE) compared to materials that form the external surface of the thermoelectric material coated. It is noted that $MgF_2$ is somewhat unusual in that CTE value depends on the orientation of the crystal. In one orientation, the value is $13.7 \times 10^{-6}$/K and in an orientation, rotated 90 degrees it is $8.9 \times 10^{-6}$/K. The average of these two values is $11.3 \times 10^{-6}$/K which is reported on Table 2 for $MgF_2$.

The alkaline earth halide material of the protective coating can be judiciously selected to match the CTE of material of the external surface of the substrate coated. The materials should have similar or nearly identical CTEs. For instance, in some embodiments, the protective coating material may have a CTE preferably within about ±12% of that of the thermoelectric material of the external surface of substrate. Within this tolerance range it is believed that the protective coating is essentially ensured to remain intact and will not crack or mechanically fail in response to the stress from differences in coefficients of thermal expansion. This is not to say that being outside the tolerance is unacceptable, and for some cases being outside this range have indeed been found acceptable. It is just a rule of thumb.

As a comparison, silicon dioxide ($SiO_2$), a popular and common protective coating has a CTE of $0.5 \times 10^{-6}$ (1/K). Conventional coatings material like this result in large mismatch in coefficient of thermal expansion with thermoelectric materials. They may be mismatched by at least 25% or probably much more, which results in their cracking. The thermal stress would lead to the catastrophic failure of $SiO_2$ and other conventional material as a sublimation protective coating.

TABLE 1

Thermal expansion coefficients of some classic thermoelectric materials.

| Thermoelectric Material | CTE (1/K) |
|---|---|
| PbTe | $19.8 \times 10^{-6}$ |
| SnTe | $16.5 \times 10^{-6}$ |
| PbSe | $19.4 \times 10^{-6}$ |
| $CoSb_3$ | $13.5 \times 10^{-6}$ |
| TAGS (85% GeTe) | $15.0 \times 10^{-6}$ |

TABLE 2

Thermal expansion coefficients of four alkaline earth fluoride protective coating materials

| Protective Coating Material | CTE (1/K) |
|---|---|
| $MgF_2$ | $11.3 \times 10^{-6}$ |
| $CaF_2$ | $18.9 \times 10^{-6}$ |
| $SrF_2$ | $18.4 \times 10^{-6}$ |
| $BaF2$ | $19.9 \times 10^{-6}$ |

The alkaline earth halide coating may be applied to the substrate using various methodologies to form a monolithic, chemically inert thin film (e.g., less than one micrometer) that is deposited directly on the active material and will not crack under thermal loads. The coating can be formed as a dense very thin-film. One way is by direct evaporation, such as using a vacuum evaporation technique.

Another way is by a solution-precipitation process. This is inexpensive, and may be an easier deposition method for production. Some of the protective coating materials described here are soluble in common solvents, such as water. For example, the solubility of barium fluoride ($BaF_2$) is 0.12 grams per 100 $cm^3$ of water. Therefore, for a supersaturated aqueous solution of barium fluoride, a continuous thin film of precipitated $BaF_2$ can be obtained by forcing the dissolved material out of solution. If the material or device part to be coated is immersed, then the coating will be obtained on that. An additional benefit from a solution-precipitation method is that the chemistry of the precipitated coating can be custom designed through the use of other dissolved materials. For example, if a mixed fluoride coating of $CaF_2$ and $BaF_2$ is desired, there are wet-chemical processes that can be designed to produce the exact chemistry that is desired. See, e.g., P. Fedorova, et al., "Coprecipitation from Aqueous Solutions to Prepare Binary Fluorides", Russian Journal of Inorganic Chemistry, Vol. 56, No. 10, p. 1525 (2011), herein incorporated by reference in its entirety.

Examples: lead telluride (PbTe) and lead selenide (PbSe) substrates coated with magnesium fluoride ($MgF_2$).

A demonstration was performed using samples of a state-of-the-art thermoelectric materials, PbTe and PbSe, coated with magnesium fluoride ($MgF_2$), a common alkaline earth halide. PbSe has behavior that is similar to PbTe, but it is less efficient at conversion of heat energy to electrical energy. Nonetheless, both are known thermoelectric materials. Silicon was used as a control.

Figure 3:
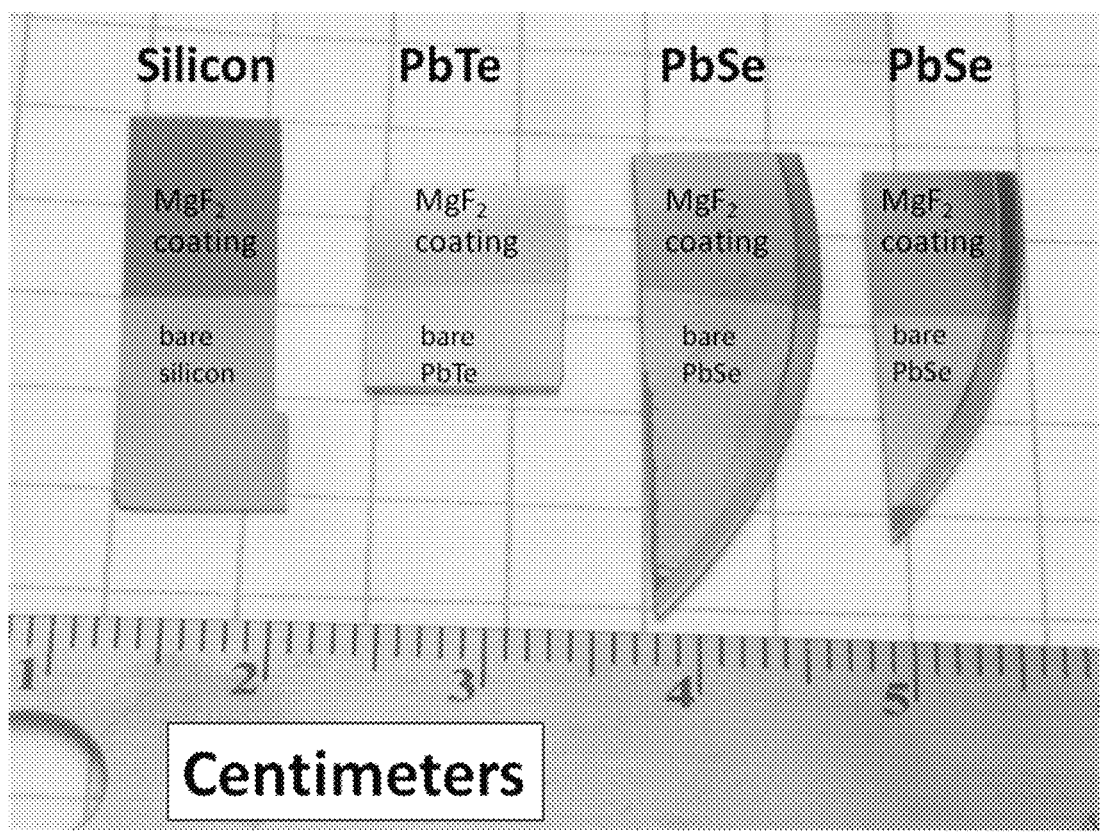
FIG. 3 is a photograph showing magnesium fluoride coated samples lead telluride, and lead selenide, along with silicon as a control, used for an exemplary sublimation demonstration according to embodiments.

The coefficients of thermal expansion for both PbTe and PbSe, and MgF$_2$ are given in Tables 1 and 2, and although not perfectly matched, they are close, i.e., $19.8 \times 10^{-6}$/K for PbTe, $19.4 \times 10^{-6}$/K for PbSe and $11.3 \times 10^{-6}$/K for MgF$_2$. The demonstration involved depositing an ultra-thin layer (less than about 1 micrometer) of MgF$_2$ on the top half of the PbTe sample, as well as the top halves of two samples of PbSe and one for silicon. The bottom halves of the for samples were left bare. FIG. 3 is a photograph showing the magnesium fluoride coated samples of silicon (control), lead telluride, and lead selenide used for the sublimation demonstration, as labelled. For this demonstration, the mass-loss due to sublimation was determined by comparing the initial and final step-heights for the MgF$_2$ at the edge of the MgF$_2$ coating.

Figure 4:
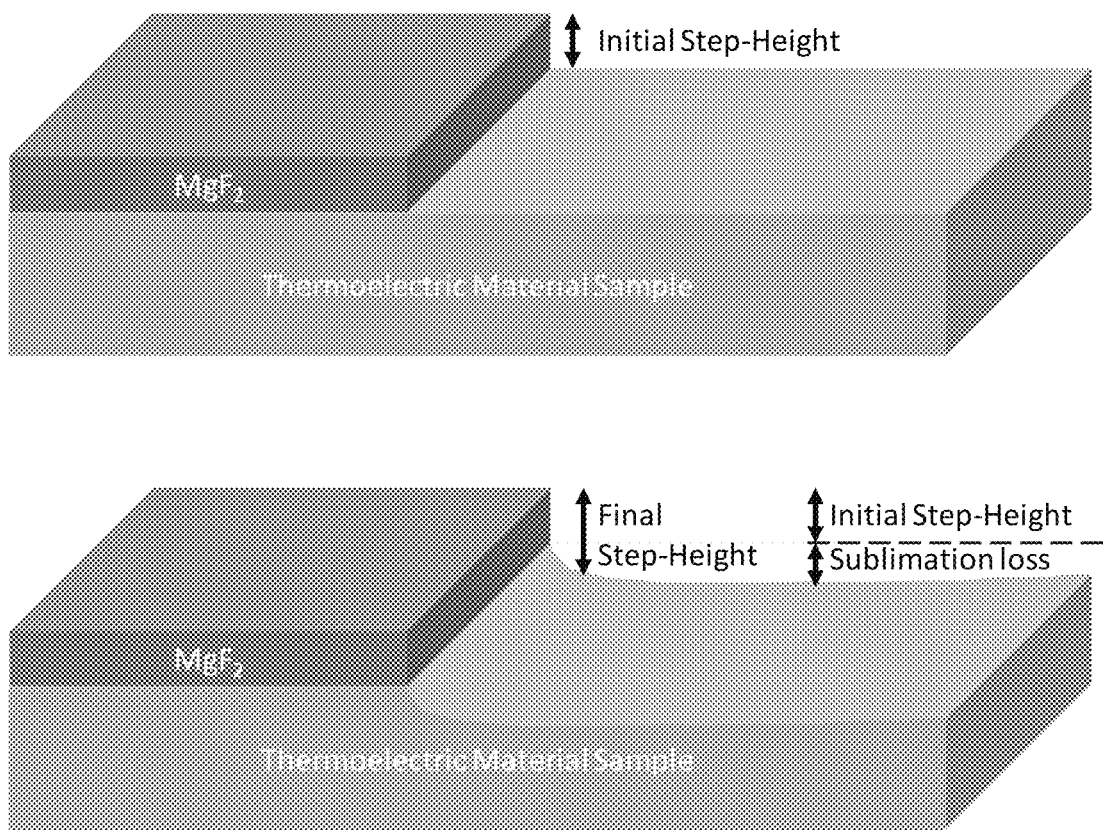
FIG. 4 is illustration showing step-height measurements used in the demonstration.

As schematically shown in FIG. 4, the initial step-height before heat-treatment is simply a measure of the MgF$_2$ coating thickness. After heat treatment, the total step height is a measure of the MgF$_2$ coating thickness plus the loss in thickness because of sublimation. To proceed with the demonstration, the partially coated samples were encapsulated under vacuum in clear-fused quartz ampoules and heat-treated at 490° C. for 72 hours. To obviate thermal shock effects, the samples were slow-cooled to room-temperature over 12 hours, as shown in the schematic temperature profile shown in FIG. 5.

Figure 2:
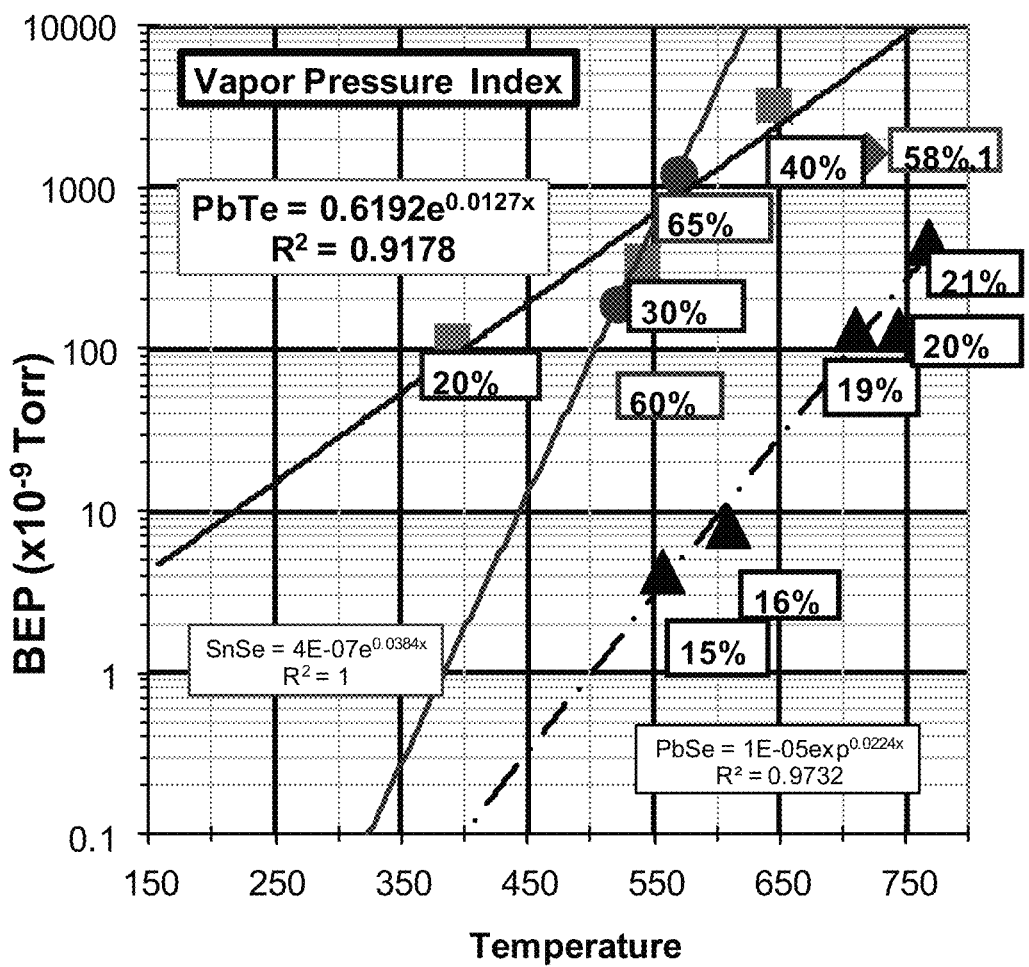
FIG. 2 is a plot of the beam equivalent pressure of PbTe, PbSe, and SnSe as a function of temperature as an index for equilibrium vapor pressure.

With reference to the plot in FIG. 2, the beam equivalent pressure of PbTe is $0.4 \times 10^{-6}$ Torr, and that of PbSe is $1 \times 10^{-9}$ Torr. The BEP of silicon was not measured because it is known to be so low as to be not measureable at 490° C. For that reason, silicon served as a reference standard or "control" because it will not sublime during the demonstration, and therefore can be used to determine any changes in the MgF$_2$ layer. The large BEP of PbTe indicates that there should be measurable loss of the uncoated PbTe during the heat-treatment, but for the uncoated PbSe whose BEP is more than 100 times lower, the loss should be small.

The results of the demonstration are summarized in Table 3, below. The as-deposited step-height of the MgF$_2$ coating was a small fraction of a micrometer: approximately 0.345 µm to 0.350 µm.

TABLE 3

Total step-height measurements for the MgF$_2$ coating before, and after thermal treatment.

|  | Silicon | PbSe | PbTe |
| --- | --- | --- | --- |
| Total step-height before heat treatment | 0.345 µm | 0.350 µm | 0.350 µm |
| Total step-height after heat treatment | 0.335 µm | 0.340 µm | 0.485 µm |

Figure 5:
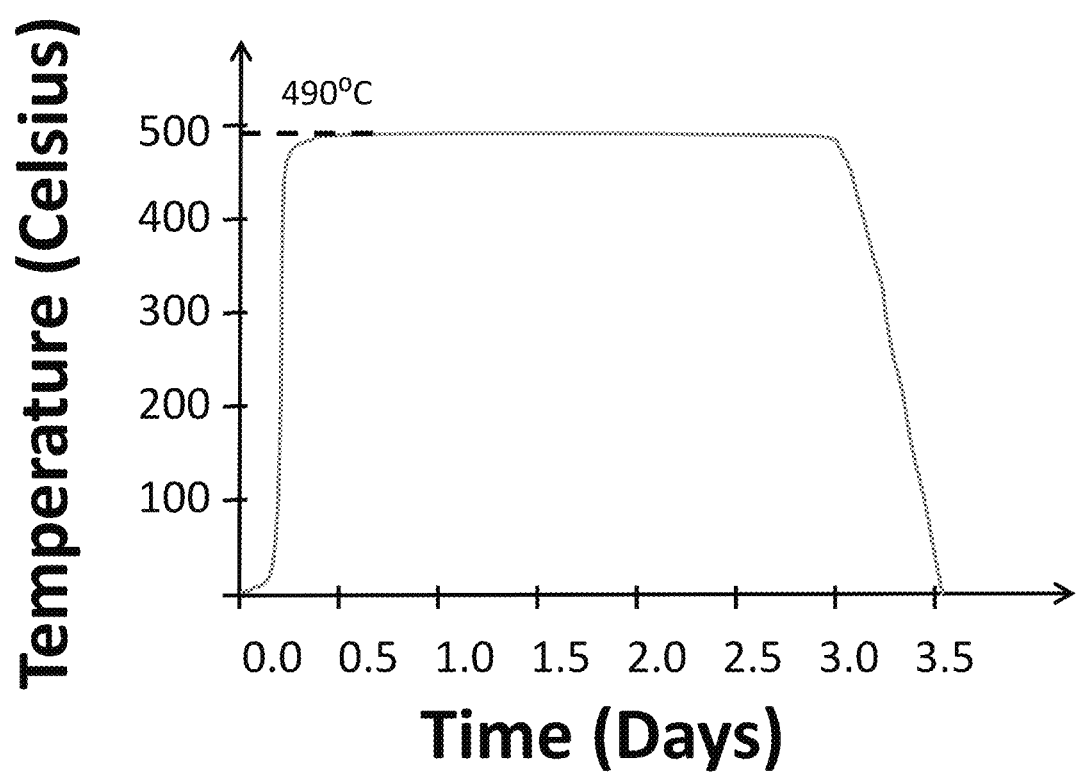
FIG. 5 is a plot of a heat treatment schedule according to an embodiment.

After the scheduled heat-treatment of FIG. 5, there was a small decrease in the MgF$_2$ coating thickness for the control. The decrease may indicate that the as-deposited the MgF$_2$ coating is not fully dense until after thermal annealing. Similar to the control, there was little change in the step-height for the PbSe samples because of the low equilibrium vapor pressure of PbSe at 490° C. However, the BEP of the PbTe is almost three orders of magnitude higher resulting in more sublimation loss and therefore; there is a large change in step-height. Assuming the same change in MgF$_2$ for the PbTe as seen for the Si control and PbSe (a loss of −0.01 µm), there is a net loss of −0.125 µm of PbTe from the unprotected area because of sublimation.

These results successful demonstrate that the PbTe and PbSe underneath the MgF$_2$ protective coating are completely protected from sublimation loss.

Figure 6:
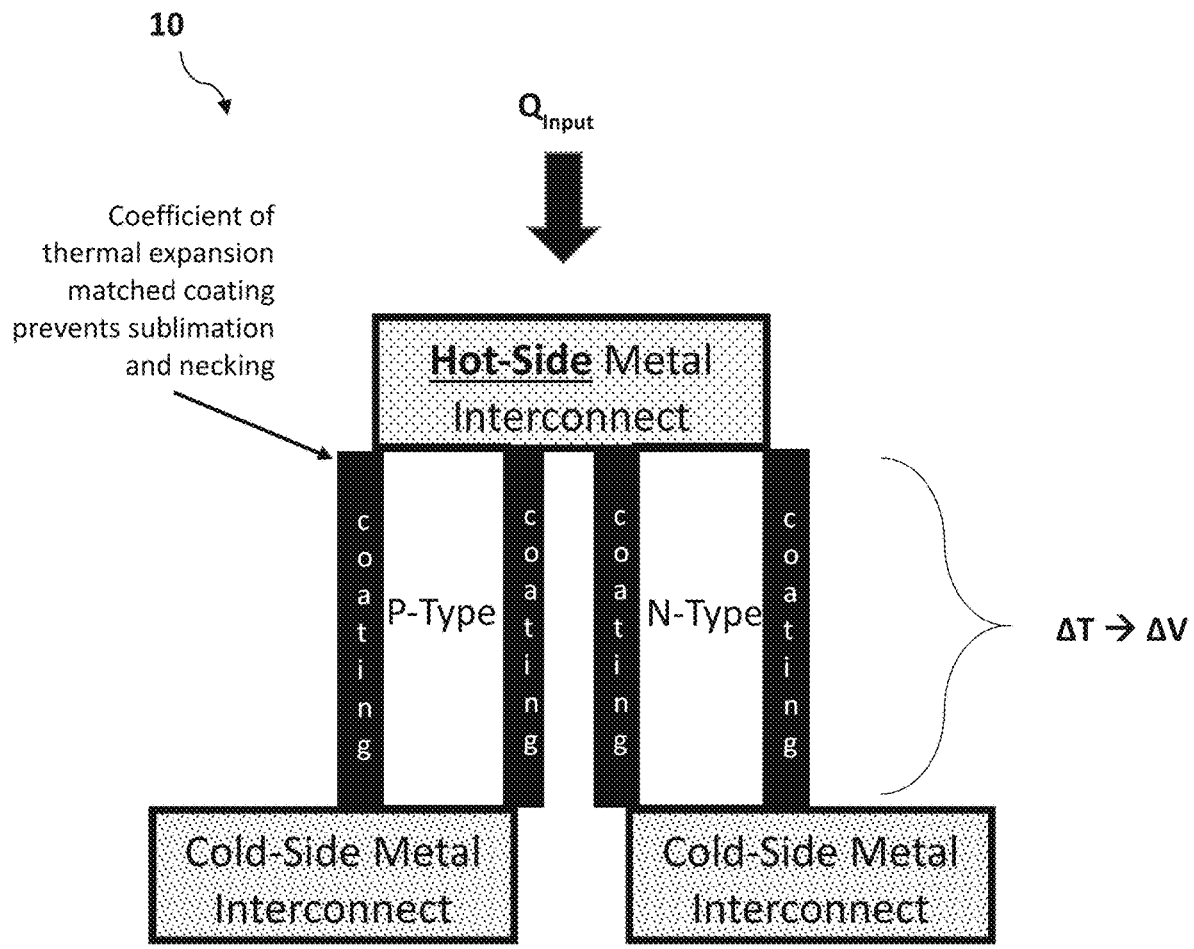
FIG. 6 is a schematic of a thermoelectric power generating device having a protective coating to prevent sublimation according to embodiments of the invention.

FIG. 6 is a schematic of a thermoelectric power generating device 10 having a protective coating to prevent sublimation according to embodiments of the present invention. It comprises P-type and N-type semiconductors spaced between, and in parallel, with metal interconnects. The thermoelectric device 10 accepts a thermal (heat) input, $Q_{input}$. In this particular illustration, the top metal interconnect or contacts of the device 10, where the heat input, is received may be referred to as the "Hot-Side" metal interconnect, whereas the bottom surface(s) of device, opposite to the heat input, may be referred to as the "Cold-Side" metal interconnects. With heat applied there is a temperate difference, $\Delta T$, between the Hot-Side and Cold-Side metal interconnects and the P-type and N-type semiconductors. The thermoelectric device 10 generates a voltage potential, $\Delta V$, in response the temperature difference, $\Delta T$. Because the magnitude of that power is proportional to $\Delta T^2$ and the efficiency is proportional to the temperature different $\Delta T$, there is significant benefit and interest to operate thermoelectric devices across increasingly larger $\Delta T$.

In contrast to the typical thermoelectric device 500 shown in FIG. 1, which the active semiconductors have bare external surfaces, the thermoelectric device 10 of FIG. 6 has a protective coating layer of an alkaline earth halide covering the active external surface of the semiconductors. The coefficient of thermal expansion of the protective coating is matched to the semiconductor to prevent sublimation and loss of material on of surfaces of the semiconductors and necking.

The alkaline earth halide protective coatings are a novel solution that addresses all of the aforementioned weaknesses described above with respect to the background. Because the alkaline earth materials are matched in terms of thermal expansion, they can be in direct contact, and not crack for their entire service life. The integral contact surface layer stops sublimation because no vapor can form or escape. The alkaline earth coating can be formed as an extremely thin surface layer or layers and thereby should not introduce performance penalties such as thermal leak paths. Further, they are electrically insulating, and cannot serve as short-circuit paths. The alkaline earth coating are also extremely stable, and chemically inert, and will not react with or degrade the chemistry of the active materials.

In addition, to preventing sublimation, the alkaline earth protective coatings described here may be used for:

1) applications where a material may need a non-reactive surface layer that has closely matched coefficient of thermal expansion, e.g., corrosion resistant coatings on metals;

2) applications where oxidation is an issue that needs to be controlled; and 3) applications where the surface of a material needs to be protected against environmental degradation, or electrical short-circuiting.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present disclosure and its practical applications, to thereby enable others skilled in the art to best utilize the invention and various embodiments with various modifications as may be suited to the particular use contemplated.

While the foregoing is directed to embodiments of the present invention, other and further embodiments of the invention may be devised without departing from the basic scope thereof, and the scope thereof is determined by the claims that follow.

We claim:

1. A thermoelectric part comprising:
a substrate comprising a thermoelectric material which converts thermal energy into a voltage potential having a surface temperature of at least 350° C. during operation of the thermoelectric part; and
a protective coating comprising an alkaline earth halide directly formed on an external surface of the substrate and exposed to an ambient environment,
wherein the external surface of the substrate, if exposed to the ambient environment at the surface temperature would sublime, but the protective coating prevents sublimation of the external surface of the substrate at the surface temperature, and
the protective coating has a thickness of less than about 1 μm.

2. The thermoelectric part of claim 1, wherein the alkaline earth halide comprises any compound of a group II element and a group VII element of the periodic table.

3. The thermoelectric part of claim 1, wherein the external surface of the substrate is formed of a thermoelectric material, and wherein the thermoelectric material comprising: PbTe, SnSe, PbSe, $CoSb_3$ or TAGS.

4. The thermoelectric part of claim 1, wherein the alkaline earth halide comprises:
$MgF_2$, $CaF_2$, $SrF_2$ or $BaF_2$.

5. The thermoelectric part of claim 1, wherein the protective coating comprises one or more alkaline earth halide materials, or mixtures thereof.

6. The thermoelectric part of claim 1, wherein the substrate comprises at least one semiconductor.

7. The thermoelectric part of claim 6, wherein the at least one semiconductor comprises a P-type or N-type semiconductor.

8. The thermoelectric part of claim 1, wherein material of the protective coating and material of the external surface of the substrate have similar or nearly identical coefficients of thermal expansion.

9. The thermoelectric part of claim 8, wherein the material of the protective coating and the material of the external surface of the substrate have coefficients of thermal expansion within about ±12% of each other.

10. The thermoelectric part of claim 1, wherein the protective coating is chemically inert with respect to material of the external surface of the substrate.

11. The thermoelectric part of claim 1, wherein the external surface of the substrate is completely sealed by the protective coating.

12. The thermoelectric part of claim 1, wherein the thermoelectric part operates with a surface temperature in excess of 450° C.

13. The thermoelectric part of claim 1, wherein the protective coating forms an outermost surface of the thermoelectric part.

14. The thermoelectric part of claim 1, wherein no thermoelectric material of the thermoelectric part is exposed to the ambient environment.

15. The thermoelectric part of claim 1, wherein there is only a single layer of the protective coating.

16. The thermoelectric part of claim 1, wherein there is no loss of the external surface of the substrate underneath the protective coating due to sublimation after a heat treatment is performed according to the schedule shown in FIG. 5.

17. A thermoelectric device comprising:
semiconductor substrates formed of thermoelectric material which converts thermal energy into a voltage potential having a surface temperature of at least 350° C. during operation of the thermoelectric device, wherein the semiconductor substrates are in parallel and spaced between conductive interconnects, such that when thermal energy is applied to one of the interconnects, there is a temperature difference across the semiconductor substrates which generates a voltage potential,
wherein external surfaces of the thermoelectric material, if exposed to an ambient environment at the surface temperature would sublime, but have a protective coating comprising an alkaline earth halide and exposed to the ambient environment to prevent sublimation of the external surfaces of the thermoelectric material at the surface temperature, and
the protective coating has a thickness of less than about 1 μm.

18. The thermoelectric device of claim 17, wherein said conductive interconnects comprise a hot-side contact and a cold-side contact, and the protective coating seals interfaces of the semiconductor substrates with the hot-side contact and the cold-side contact preventing necking due to sublimation of the thermoelectric material at the interfaces.

19. A thermoelectric device comprising:
semiconductor substrates formed of thermoelectric material which converts thermal energy into a voltage potential having a surface temperature of at least 350 ° C. during operation of the thermoelectric device, wherein the semiconductor substrates are in parallel and spaced between conductive interconnects, such that when thermal energy is applied to one of the interconnects, there is a temperature difference across the semiconductor substrates which generates a voltage potential,
wherein external surfaces of the thermoelectric material is formed of thermoelectric material selected from the group consisting of: PbTe, SnSe, PbSe, $CoSb_3$ and TAGS, and, if exposed to an ambient environment at the surface temperature would sublime, but have a protective coating consisting of an alkaline earth halide selected from the group consisting of: $MgF_2$, $CaF_2$, $SrF_2$ and $BaF_2$ and exposed to the ambient environment to prevent sublimation of the external surfaces of the thermoelectric material at the surface temperature.

20. The thermoelectric device of claim 19, wherein the wherein the protective coating has a thickness of less than about 1μm.

21. A method of preventing sublimation comprising:
providing a substrate comprising a thermoelectric material which converts thermal energy into a voltage potential;
forming a protective coating comprising an alkaline earth halide on the entire exposed outer surface of the thermoelectric material of the substrate, the protective coating exposed to an ambient environment; and
performing a heat treatment of at least 350° C. after forming the protective coating,
wherein the protective coating formed prevents sublimation of the outer surface of the thermoelectric material at during the heat treatment, and the protective coating has a thickness of less than about 1 µm.

22. The method of claim 21, where the protective coating is applied by direct evaporation.

23. The method of claim 22, wherein the protective coating is applied using vacuum evaporation or a solution-precipitation process.

24. The method of claim 21, wherein the heat treatment is performed according to the schedule shown in FIG. 5.

25. A method of operating a substrate to prevent sublimation comprising:
  operating the substrate with a surface temperature of at least 350° C., wherein the substrate comprises a thermoelectric material which converts thermal energy into a voltage potential,
  wherein outer external surfaces of the thermoelectric material, if exposed to an ambient environment at the surface temperature would sublime, but have a protective coating comprising an alkaline earth halide and exposed to the ambient environment to prevent sublimation of the outer external surfaces of the thermoelectric material at the surface temperature, and
  the protective coating has a thickness of less than about 1 µm.

* * * * *